(12) United States Patent
Horikoshi et al.

(10) Patent No.: US 6,815,717 B2
(45) Date of Patent: Nov. 9, 2004

(54) THIN-FILM TRANSISTOR AND METHOD OF MANUFACTURING THE SAME

(75) Inventors: Kazuhiko Horikoshi, Yokohama (JP); Kiyoshi Ogata, Kawasaki (JP); Miwako Nakahara, Yokohama (JP); Takuo Tamura, Yokohama (JP); Yasushi Nakano, Mobara (JP); Ryoji Oritsuki, Shirako (JP); Toshihiko Itoga, Hino (JP); Takahiro Kamo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/988,585

(22) Filed: Nov. 20, 2001

(65) Prior Publication Data

US 2002/0113264 A1 Aug. 22, 2002

(30) Foreign Application Priority Data

Feb. 20, 2001 (JP) ........................................ 2001-042694

(51) Int. Cl.[7] ........................ H01L 29/04; H01L 31/036
(52) U.S. Cl. ........................ 257/64; 257/65; 257/70; 257/75; 257/347
(58) Field of Search ............................. 257/59, 64–66, 257/70, 75, 406–407, 410–411, 347

(56) References Cited

U.S. PATENT DOCUMENTS

| | | | | |
|---|---|---|---|---|
| 6,025,630 A | * | 2/2000 | Yamazaki et al. | ............ 257/347 |
| 6,118,151 A | * | 9/2000 | Tsutsu | ............ 257/347 |
| 6,127,279 A | | 10/2000 | Konuma | |
| 6,168,980 B1 | * | 1/2001 | Yamazaki et al. | ............ 438/162 |
| 6,541,278 B2 | | 4/2003 | Morita et al. | |

FOREIGN PATENT DOCUMENTS

JP           8-195494       *   7/1996

OTHER PUBLICATIONS

"*A Handbook on Liquid Crystal Display Panel Manufacturing Technique,*" p. 193, 1992, Science Forum. [partial English translation included].
Anma, M. "*A New Measurement of Thermal Dimensional Stability of Glass and Its Application to LCD Substrates,*" Glass Technology, vol. 40, No. 4, Aug. 1999.
Tseng et al., "*Thin CVD Stacked Gate Dielectric for ULSI Technology,*" 1993, IEDM 93, pp. 321–324.
Patent Abstracts of Japan 08–195494 Jul. 30, 1996.

* cited by examiner

Primary Examiner—Thien F Tran
(74) Attorney, Agent, or Firm—Antonelli, Terry, Stout & Kraus, LLP

(57) ABSTRACT

To a polycrystalline silicon layer crystallized by irradiation with laser light, a mixed gas comprised of ozone gas and $H_2O$ or $N_2O$ gas is fed at a processing temperature of 500° C. or below, or the polycrystalline silicon layer is previously treated with a solution such as ozone water or an aqueous $NH_3$/hydrogen peroxide solution, followed by oxidation treatment with ozone, to form a silicon oxide layer with a thickness of 4 nm or more at the surface of the polycrystalline silicon layer for forming a thin-film transistor having characteristics that are less varying on a glass substrate previously not annealed.

8 Claims, 5 Drawing Sheets

THIN-FILM TRANSISTOR AND METHOD OF MANUFACTURING THE SAME

This application is based on Japanese Patent Application No. 2001-042694 filed in Japan, the contents of which are incorporated hereinto by reference.

BACKGROUND OF THE INVENTION

1. Field of the Invention

This invention relates to a thin-film transistor used in liquid-crystal display devices and a process of manufacturing the thin-film transistor.

2. Description of the Related Art

In recent years, in liquid-crystal display used as display devices such as notebook personal computers, mobile appliances and so forth, their drive systems are being changed over from simple matrix systems to active matrix systems. In particular, thin-film transistor (hereinafter often "TFT") active matrix drive systems are becoming prevailing in which a large number of thin-film transistors have been formed on a glass substrate.

Among TFT drive systems, TFTs making use of polycrystalline silicon layers have a larger electron mobility than those making use of amorphous silicon layers. Hence, they can be fabricated on glass substrates not only as transistors of displaying pixel areas but also as driving transistors.

Conventionally, since the formation of polycrystalline silicon requires a high temperature of about 1,000° C., it has been indispensable to use expensive quartz glass substrates as substrates.

Recently, development has been brought forward on techniques by which polycrystalline silicon can be formed at a processing temperature of about 600° C., and it has become possible to use glass materials other than quartz substrates. In this method, amorphous silicon film formed on a glass substrate is subjected to laser irradiation or the like, whereby only the amorphous silicon film can be heated and crystallized without causing a rise in substrate temperature.

Meanwhile, in integrated circuit devices making use of single-crystal silicon substrates, thermal oxides (layer thickness: about few nm to tens of nm) of silicon are used as gate-insulating layers. However, the formation of such thermal oxides of silicon requires heat treatment at about 1,000° C., and this processing can not be utilized in the process of manufacturing polycrystalline silicon TFTs which prerequisites the processing temperature of 600° C. or below.

In processes of manufacturing TFTs, TEOS (tetraethoxysilane) is used as a material, and $SiO_2$ layer (layer thickness: about 100 nm) formed by plasma-assisted CVD (chemical vapor deposition) is used as gate-insulating layer. The $SiO_2$ layer formed by plasma-assisted CVD (hereinafter "TEOS layer"), however, has so high an interfacial state density that a great performance deterioration of TFT characteristics may be brought about as is seen in, e.g., variations of threshold voltage when it is used as the gate-insulating layer as it is. Moreover, in such a case, the breakdown strength of TFT may severely deteriorate with time to cause dielectric breakdown of the TFT as a result thereof. Accordingly, at the interface of the gate-insulating layer for TFT and the silicon layer, it is desirable to form an oxide layer having low interfacial state density, comparable to thermal oxides formed by thermal oxidation of silicon.

To cope with the above problem, e.g., Japanese Patent Application Laid-open No. 8-195494 discloses a method of manufacturing a polycrystalline silicon TFT at a processing temperature of 600° C. or below, using a conventional highly heat-resistant glass substrate.

According to the above method disclosed in Japanese Patent Application Laid-open No. 8-195494, since the polycrystalline silicon layer is formed at a temperature of about 600° C., a usable glass substrate is limited to an annealed glass substrate. Hence, when an unannealed glass substrate is used in place of the annealed glass substrate, the temperature condition of about 600° C. may cause a shrinkage of the glass substrate, and this may cause a warpage or strain of the glass substrate to bring about difficulties such as break of the glass substrate itself and peel of the layer, at worst.

In general, the higher strain point the glass has, the higher thermal stability it has. Such glass, however, is difficult to melt, mold and work in the step of producing the glass substrate, resulting in a high production cost. Accordingly, in order to control the cost, a production method is essential which enables use of glass which has a low strain point and is inexpensive.

Usually, alkali-free glass substrates used as substrates of thin-film transistors have a strain point of about 600° C., and compaction (heat shrinkage) of glass becomes great abruptly as a result of heat history at upper temperatures than at a temperature a little lower than the strain point. For example, an unannealed glass substrate CORNING 7059F (Trade name: available from Corning Glass works; strain point 593° C.) shows a compaction of about 800 ppm as a result of heat history at 600° C., for 1 hour and at a cooling rate of 1° C./minute. Also, in the case of CORNING 1735F (strain point: 665° C.), having a higher strain point, it shows a compaction of 173 ppm upon application of the same heat history as the above. Then, it has been made possible to lower compaction due to the like heat history to about 10 ppm by carrying out annealing previously at 660° C./1 hr.

Substrates for polycrystalline TFT panels are usually required to show a heat shrinkage rate (compaction) of 20 ppm or less. Accordingly, it has ever been considered indispensable to use annealed glass substrates (Liquid-Crystal Display Fabrication Technique Handbook, compiled by Ryuji Shimada, published by Science Forum, pp.191–199). Thus, where the upper limit of processing temperature is merely lowered to temperature of such a degree that the shrinkage of unannealed glass substrates is negligible, e.g., to 450–500° C., a problem discussed below may occur.

That is, as a gate-insulating layer formed on a polycrystalline silicon layer, as stated previously an $SiO_2$ layer is formed in a layer thickness of about 100 nm by plasma-assisted CVD (chemical vapor deposition) using TEOS (tetraethoxysilane) as a material gas (herein "TEOS layer"). At the interface between the polycrystalline silicon layer and the insulating layer formed of TEOS, however, the interfacial density of the TEOS layer becomes so high that the threshold voltage required of a TFT tends to vary and also the breakdown strength of the gate-insulating layer thereof may severely deteriorate with time. Thus, there is a great problem on the reliability of TFT.

SUMMARY OF THE INVENTION

Hence, in the case when the use of an unannealed glass substrate is premised, it is important to design to keep the upper limit of processing temperature at about 450 to 500° C. and lower the interfacial state density between the polycrystalline silicon layer and the gate-insulating layer to a level corresponding to that of any silicon oxide layer formed by thermal oxidation.

An object of the present invention is to solve the problem discussed above, and form a highly reliable TFT having a polycrystalline silicon layer, under low-temperature processing conditions and yet on an unannealed glass substrate. Here, in the present invention, a glass substrate showing a compaction of 30 ppm or higher when the glass substrate is heated at 600° C. for 1 hour and thereafter cooled at a rate of 1° C./minute is defined as the unannealed glass substrate.

To achieve the above object, in the present invention, i) a polysilicon crystal layer for forming a channel region, a source region and a drain region and ii) a first insulating layer and a second insulating layer are formed at the upper part of an unannealed glass substrate. Also, a gate region is formed at a position corresponding to the channel region and on the second insulating layer. And a gate electrode, a source electrode and a drain electrode are also formed to make electrical interconnection with the gate region, the source region and the drain region, respectively.

Here, it is preferable that the first insulating layer is a silicon oxide layer formed by oxidizing the surface of the channel region at a temperature of 500° C. or below, and is so formed as to cover the surface of at least the channel region and to have a layer thickness of 4 nm or larger.

In the present invention, it is preferable that the first insulating layer, e.g., a silicon oxide layer, is formed by oxidizing the surface of a polycrystalline silicon layer in an atmosphere containing at least ozone, for example, an atmosphere containing ozone and $H_2O$ or an atmosphere containing ozone and $N_2O$. Also, in the present invention, in the step of forming the first insulating layer, it is preferable that a first silicon oxide layer is formed at the surface of the polycrystalline silicon layer by the use of an oxygen-donating solution, and thereafter a second silicon oxide layer is formed between the first silicon oxide layer and the polycrystalline silicon layer in an atmosphere containing ozone.

In the present invention, the second insulating layer provided at the upper part of the first insulating layer may be formed by chemical vapor deposition, physical vapor deposition or spin coating.

Since as described above the silicon oxide layer is formed by oxidizing the surface of a polycrystalline silicon layer in an ozone atmosphere containing $H_2O$ or $N_2O$, the interface between the polycrystalline silicon layer and the silicon oxide layer can be kept in a good state. Moreover, since the silicon oxide layer can be formed at a processing temperature lower than ever, a relatively inexpensive, unannealed glass substrate can be used as the substrate.

In other words, the thin-film transistor manufactured by the above method has a good interface between the surface of the channel region comprised of polycrystalline silicon and the gate insulating layer formed thereon, and hence the thin-film transistor characteristics concerned closely with the interfacial state density thereat, as exemplified by threshold voltage, can be made to vary less, so that superior TFT characteristics can be exhibited. In addition, since the unannealed glass substrate can be used as the substrate, the TFT can be formed in a large area and at a low cost, compared with quartz glass substrates or the like.

In the above means for solving the problem, the insulating layer has a double-layer structure, which, however, need not necessarily be limited thereto.

BRIEF DESCRIPTION OF THE DRAWINGS

These and other features, objects and advantages of the present invention will become more apparent from the following description when taken in conjunction with the accompanying drawings wherein.

DESCRIPTION OF THE PREFERRED EMBODIMENTS

Specific embodiments of the present invention are described below with reference to the accompanying drawings.

Figure 1:
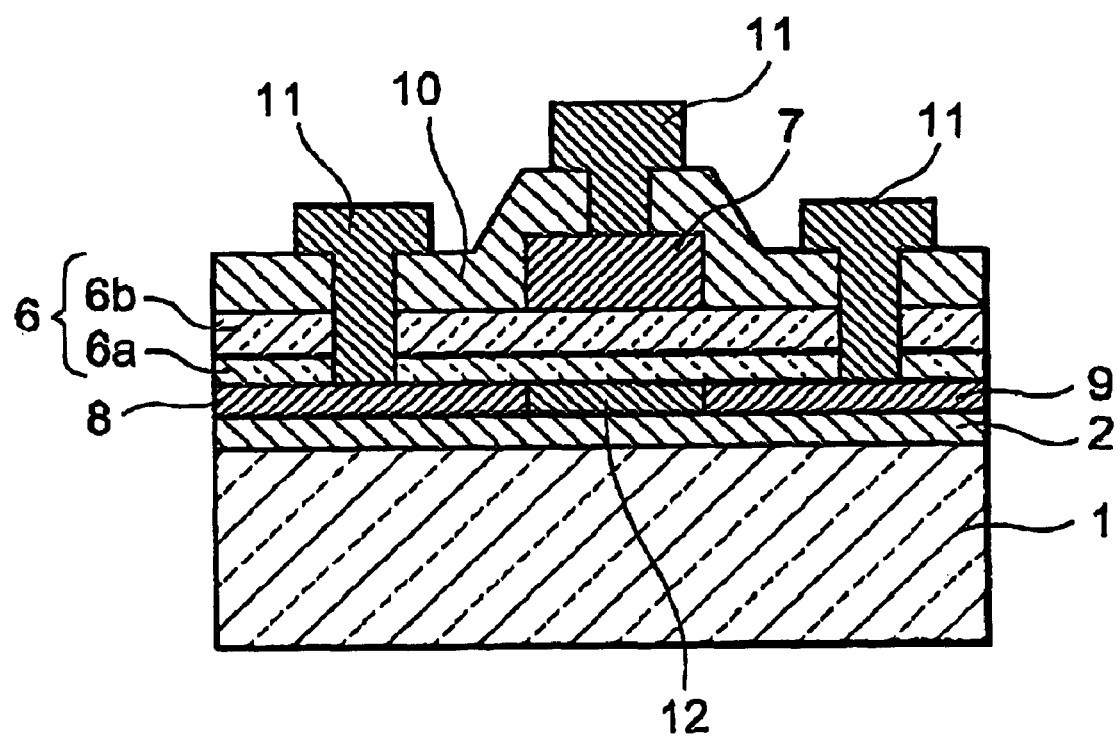
FIG. 1 is a schematic sectional view for describing a thin-film transistor according to a first embodiment.

FIG. 1 is a structural view showing a main-part cross section of a thin-film transistor according to a first embodiment. A source region 8, a drain region 9 and a channel region 12 which are composed of a polycrystalline silicon layer are formed on a diffusion preventive layer 2 formed on an unannealed glass substrate 1. Then, a gate-insulating layer 6 consisting of an $SiO_2$ layer 6a formed by oxidizing the polycrystalline silicon layer and an insulating layer 6b formed by a deposition process are provided on the channel region 12.

On the top of the gate-insulating layer 6, a gate region 7 is formed at a position corresponding to the channel region 12, and an interlaminar insulating layer 10 so formed as to cover part of the surface of this gate region 7. Then, the source region 8, drain region 9 and gate region 7 are electrically interconnected with their corresponding electrodes 11 through openings provided in is interlaminar insulating layer 10.

A method of producing the above structure shown in FIG. 1 is described below with reference to the flow diagrams shown in FIGS. 2A to 2D.

Figure 2A:
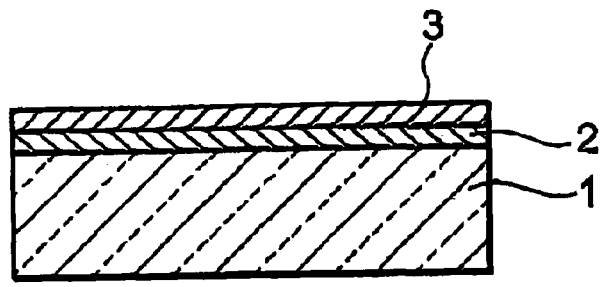
FIGS. 2A to 2D show flow diagrams for-describing various stages of a process of manufacturing the thin-film transistor according to a first embodiment.

First, on an unannealed glass substrate 1, a diffusion preventive layer 2 comprised of an SiN film or $SiO_2$ film is formed by usual plasma-assisted CVD (chemical vapor deposition). Thereafter, an amorphous silicon layer 3 (layer thickness: 50 nm) is subsequently formed by the CVD (FIG. 2A).

Figure 2B:
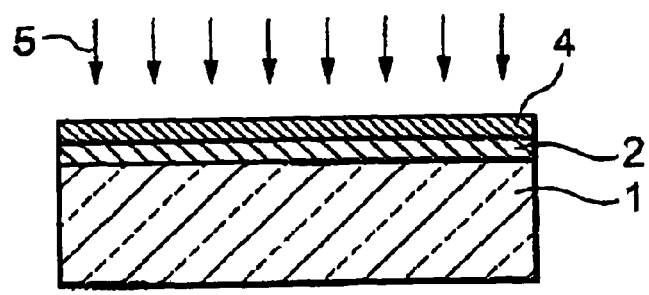

Next, the surface of the amorphous silicon layer 3 is irradiated by excimer laser light 5 to crystallize part or the whole of the amorphous silicon layer 3 to form a polycrystalline silicon layer 4 (FIG. 2B). The excimer laser light 5 is absorbed in the amorphous silicon layer 3, and then the layer 3 is heated and crystallized, and hence the unannealed glass substrate 1 is by no means heated to 450° C. or above as a result of the irradiation by this excimer laser light 5. In FIG. 2B, the step is illustrated as if the whole surface of the glass substrate 1 is irradiated by laser light. In practice, however, it is so irradiated that excimer laser light 5 converged rectangularly is scanned.

Figure 2C:
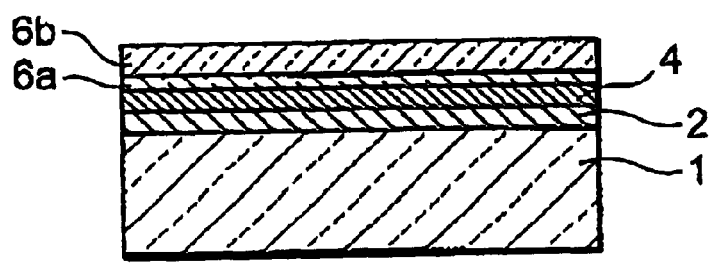

The surface of the polycrystalline silicon layer 4 thus formed is oxidized to form a silicon oxide layer 6a (first insulating layer) of 4 nm or larger in thickness. Next, an insulating silicon layer 6b (second insulating layer) of about 90 nm in thickness is formed by a deposition process such as CVD to form a gate-insulating layer 6 of about 100 nm in total layer thickness (FIG. 2C).

Figure 2D:
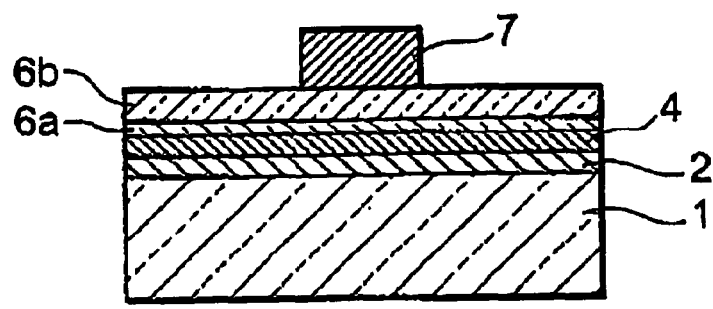

A gate region 7 is formed on the gate-insulating layer, and is worked into a desired shape (FIG. 2D). As a material for the gate region, a conductive material such as an impurity-doped silicon film, a metal or a metal compound (such as TiN or TiW) may be used.

Next, the gate region 7 thus worked being used as a mask, impurity ions are implanted into the polycrystalline silicon layer 4 to form a source region 8 and a drain region 9, followed by RTA (rapid thermal annealing) treatment for the purpose of activating impurities. Incidentally, in this RTA treatment, too, only the polycrystalline silicon layer 4 is heated and hence the underlying unannealed glass substrate is by no means heated.

Next, on the gate-insulating layer 6, an interlaminar insulating layer 10 is so formed as to cover the surface of the gate region 7 shown in FIG. 2D, Thereafter, openings for making electrical interconnection with the gate region 7, source region 8 and drain region 9 are formed at prescribed positions of the interlaminar insulating layer 10. Through the openings, corresponding electrodes 11 connected with the gate region 7, source region 8 and drain region 9 are formed. Thus, the thin-film transistor shown in FIG. 1 is completed.

Figure 3:
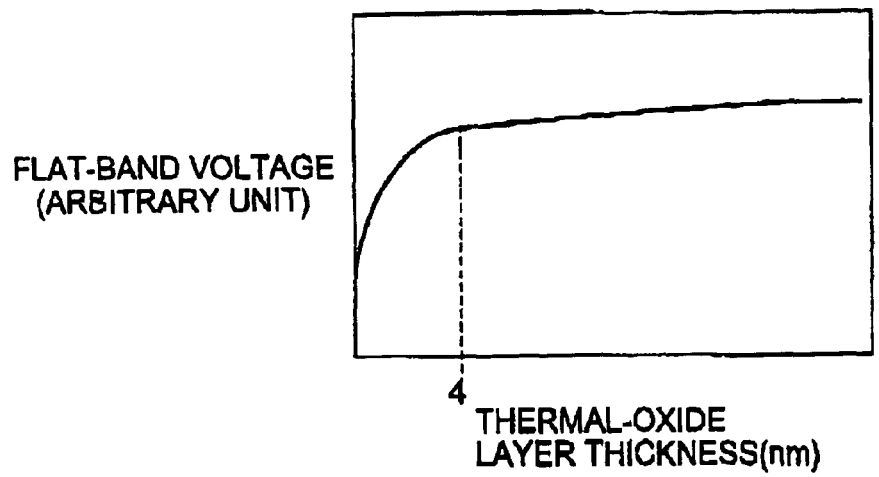
FIG. 3 illustrates the relationship between thermal-oxide layer thickness and flat-band voltage.

Now, the layer thickness of the first insulating layer shown in FIG. 2C is described. FIG. 3 shows the relationship between layer thickness of a thermal oxide (first insulating layer) and flat-band voltage in an MOS (metal oxide semiconductor) transistor having a double-layer gate-insulating layer structure of thermal oxide/TEOS, As can be seen from FIG. 3, the flat-band voltage in the MOS transistor lowers when the thermal oxide is smaller than 4 nm in layer thickness. This phenomenon occurs because the interfacial state density at the interface between the thermal oxide and the underlying layer silicon layer is so high that electrons are captured in this interfacial level to make it impossible for the transistor to exhibit its desired characteristics. On the other hand, the flat-band voltage is kept at substantially a constant value as long as the layer thickness of the thermal oxide is 4 nm or larger, making it possible to ensure the desired transistor characteristics.

Incidentally, although it is unnecessary to specifically set an upper limit of the thermal-oxide layer thickness, the thickness need not be made too large when the gate insulating layer is formed in the thermal oxide/TEOS double-layer structure. More specifically, taking account of the productivity of thin-film transistors, it is suitable for the layer thickness to be, e.g., about 20 nm in maximum, considering that the process of thermal oxidation is a process in which the oxide layer is formed at a low rate.

Figure 4:
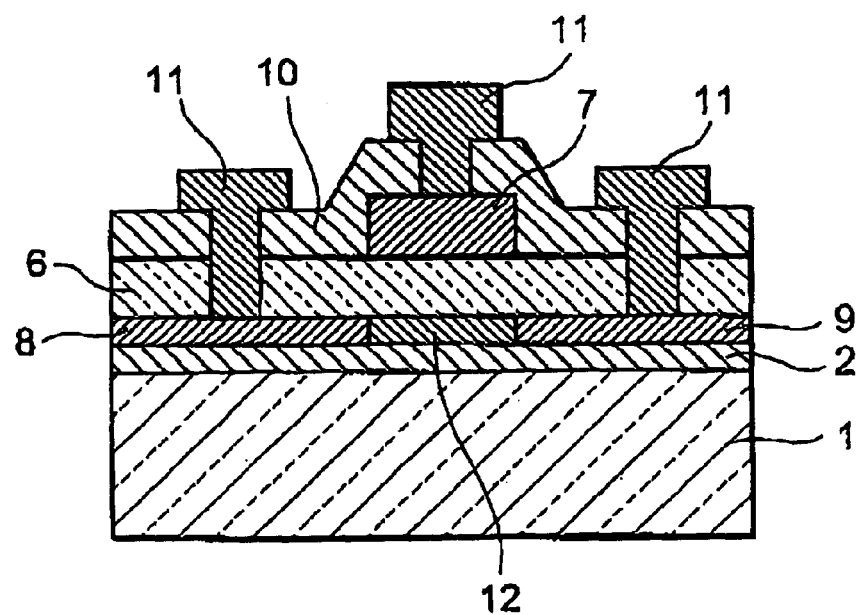
FIG. 4 is a schematic sectional view for describing a thin-film transistor according to a second embodiment.

In the above first embodiment, described is a case in which the gate-insulating layer 6 has a double-layer structure. It may also have a single-layer structure as shown in FIG. 4. In the latter case, the step of forming the second insulating layer 6b may only be omitted in the steps described above.

Methods of forming the silicon oxide layer 6a, obtained by oxidizing the surface of the polycrystalline silicon layer 4, are described below in detail.

(1) Method of forming the layer by introducing steam into ozone atmosphere:

A sample comprising the unannealed glass substrate 1 on which the polycrystalline silicon layer 4 has been formed is carried into a first processing chamber, and is heated to, e.g., about 450° C., which is a temperature of such a degree that does not adversely affect the unannealed glass substrate 1.

Meanwhile, ozone (about 10 SLM) and steam (about 100 SCCM) are introduced into a second processing chamber set adjacent to, but isolated from, the first processing chamber, and the inside of the second processing chamber is controlled to about 700 Torr. With regard to the ozone, 100 g/Nm$^3$ of ozone (ozone concentration: about 5%) is produced by means of a well known silent-discharge ozonizer, using as a material a mixed gas of pure oxygen gas (10 SLM) and a trace amount of $N_2$ gas (55 SCCM). As for the steam, pure water put into a pressure container is heated to 100 to 200° C., and steam having a pressure not lower than atmospheric pressure is produced in the pressure container. Thereafter, the steam is introduced into the second processing chamber at a flow rate of about 100 SCCM through a mass flow controller under reduced pressure.

The sample heated to 450° C. is carried from the first processing chamber into the second processing chamber kept in the above oxidizing atmosphere where the steam has been introduced into the ozone. By the processing thus carried out, the surface of the polycrystalline silicon layer 4 is oxidized, so that the first insulating layer 6a, i.e., the SiO$^2$ layer, having a layer thickness of 4 nm or larger is formed at that surface.

In the embodiment described above, in order to feed the steam stably to the second processing chamber, feed pressure is set at a pressure lower than atmospheric pressure, e.g., at 700 Torr. The feed pressure is by no means limited to 700 Torr as long as the steam can stably be fed.

(2) Method of forming the layer by introducing $N_2O$ gas into ozone atmosphere (oxynitriding):

In the same manner as in the case of the above (1), 100 SCCM of $N_2O$ gas is fed into 100 g/Nm$^3$ of ozone atmosphere in place of the steam. Thereafter, a sample heated to about 450° C. is carried into the oxidizing atmosphere described above, whereby the first insulating layer 6a having a layer thickness of 4 nm or larger can be formed at the surface of the polycrystalline silicon layer 4. In this case, nitrogen (N) is brought into the insulating layer, and a silicon oxynitride ($SiN_xO_y$) layer is formed. In the case when the present example is employed, about 0.5 atom % of nitrogen segregates at the $SiN_xO_y$p-Si interface. The oxynitride layer also has the effect of terminating dangling bonds of the $SiO_2$ layer to improve the reliability of the gate-insulating layer.

(3) Method of forming oxide layer of about 1 nm in layer thickness, subsequently followed by oxidation with ozone:

A very thin oxide layer of about 1 nm in layer thickness is previously formed at the surface of a polycrystalline silicon layer 4, and is thereafter processed in an atmosphere containing ozone, whereby the first insulating layer 6a ($SiO_2$ layer) having a layer thickness of 4 nm or larger can be formed at the surface of the polycrystalline silicon layer 4.

As a method of forming the oxide layer of about 1 nm in layer thickness, for example, a sample on which the polycrystalline silicon layer 4 has been formed may be immersed in ozone water prepared by bubbling ozone gas into pure water. Also, in place of the ozone water, the sample may be immersed in an aqueous ammonia/hydrogen peroxide solution.

The layer thickness of the silicon oxide layer formed previously at the silicon surface is by no means limited to about 1 nm, and may be enough as long as the oxide layer acts as a site on which an oxidation species such as ozone having come flying to the surface of the oxide layer are adsorbed in a large number. Accordingly, as layer thickness that affords a state in which the oxide film has a low density, it may suitably be from about 0.1 to 1 nm.

Mechanism of the oxidation of the silicon layer is briefly described below.

Upon exposure of the silicon surface to an atmosphere of the oxidation species, this oxidation species first become adsorbed on the silicon surface, and the oxidation is started. Also, in the case when silicon has the silicon oxide layer at its surface, the oxidation species having become adsorbed on the surface of the silicon oxide layer diffuses into the silicon oxide layer. With progress of the diffusion, the oxidation species reaches the interface between the silicon oxide layer and the silicon, whereupon the reaction of the silicon with the oxidation species takes place at that interface, so that the silicon oxide layer grows.

Hence, under conditions such that the silicon oxide layer formed as a result of oxidation reaction becomes thick to a certain extent and the diffusion of the oxidation species is rate-determined rather than the oxidation reaction, the rate of formation of the silicon oxide layer increases with an increase in the rate of diffusion at which the oxidation species diffuses into the silicon oxide layer.

Meanwhile, the rate of diffusion of the oxidation species is proportional to the gradation of concentration of the oxidation species in the silicon oxide layer, and hence the rate of diffusion can be made higher by making the concentration of the oxidation species higher at the outermost surface of the silicon oxide layer. To make the concentration of the oxidation species higher at the outermost surface, adsorption sites may be increased. The oxide layer of about 1 nm thick which is formed by exposing the silicon surface to the above ozone water or the aqueous ammonia/hydrogen peroxide solution is not so dense as the thermal oxide commonly widely used, and the adsorption sites at the outermost surface are present in a large number. Thus, the advance formation of the silicon oxide layer of about 1 nm thick on the silicon surface brings about the effect of adsorbing the oxidation species in a large number to make the concentration of the oxidation species higher at that surface.

The method of feeding the ozone, mentioned in the above embodiment, is described below in detail.

The ozone usually decomposes at 200° C. or above. Hence, where the ozone is fed to a substrate heated to a temperature of about 450° C., the greater part of the ozone fed by heat radiation occurring from the substrate may easily be decomposed. If the ozone is fed in a large quantity in order to avoid such inexpedience, the ozone fed in a large quantity lowers the temperature of the substrate, resulting in hindrance of the oxidation reaction at the substrate surface. Hence, in such a case, the oxide layer is not so much formed as to be expected from the ozone fed in a large quantity.

In order to accelerate the oxidation reaction at the substrate surface, it is necessary to prevent the ozone itself from decomposing and the temperature of the substrate surface from lowering, in the course before the ozone reaches the surface of the substrate. In other words, it is preferable to keep the temperature at 200° C. or below, and more preferably 150° C. or below, which is a temperature of such a degree that the ozone gas fed to the surface of the substrate does not decompose, and also to keep only the substrate surface at a high temperature.

To meet such requirements, the present inventors have made detailed analysis of temperature changes of a substrate surface which occur when the ozone is fed to the substrate surface, and, on the basis of a finding from this analysis, they have made studies on how to control the temperature of the substrate.

Figure 5:
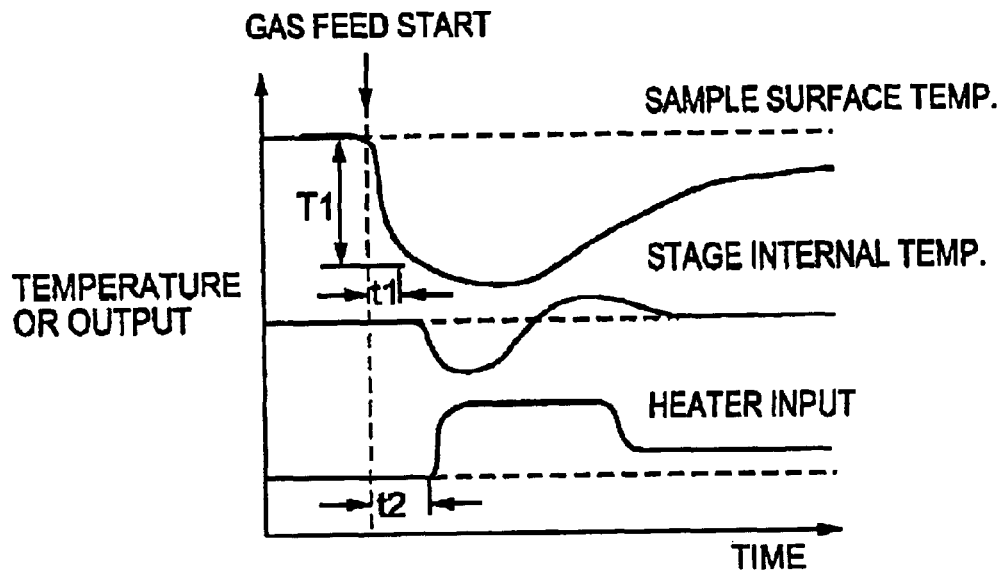
FIG. 5 illustrates a conventional substrate-heating process.

In general, where a gas is fed to the surface of a substrate in the state the substrate is held on a stage the temperature of which is controlled by means of a general-purpose heater, the temperature of the substrate surface changes as shown in FIG. 5. More specifically, in FIG. 5, the lapse of time is plotted as abscissa, and the input to a heater, the internal temperature of a stage to which the heater is attached and the surface temperature of the substrate are plotted as ordinate, showing changes of the surface temperature of the substrate.

When a stated input is kept applied to the heater, the internal temperature of the stage and the surface temperature of the substrate are both maintained at stated temperatures. However, at substantially the same time when the feeding of gas is started, the surface temperature of the substrate begins lowering abruptly. Then, on lapse of time t1 the internal temperature of the stage begins lowering, whereupon a feedback mechanism of the heater operates. After lapse of time t2, the input to the heater increases, so that the internal temperature of the stage become recovered gradually. After the internal temperature of the stage has returned to the stationary condition, i.e., the original preset temperature, the heat is taken away to a certain extent by the gas having been fed. Hence, the input to the heater becomes a little higher than that before the feeding of gas, but the surface temperature of the substrate reaches the stationary condition at a temperature lower than that before the feeding of gas.

In FIG. 5, T1 represents the amount of temperature drop caused by the feeding of gas to the surface of the substrate; and t1, the time from the start of the feeding of gas until the surface temperature of the substrate becomes lowest. As stated previously, in the process of oxidation reaction caused by ozone, a stage where the oxide layer is formed at a high rate is the initial stage of the oxidation reaction. Accordingly, in order to accelerate the oxidation reaction, it is important to keep as far as possible the temperature of the substrate surface from lowering immediately after the feeding of ozone. More specifically, the key to the growth of oxide layer is how the amount of temperature drop T1 of the substrate surface and the time t1 until the temperature lowers completely can be kept small.

Figure 6:
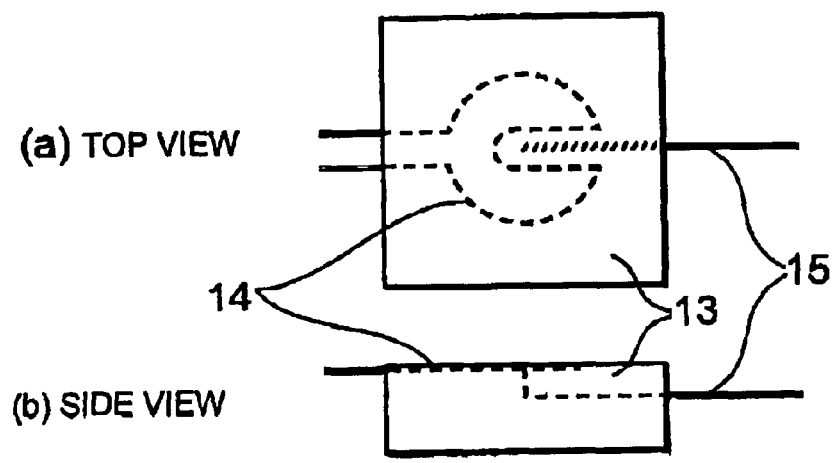
FIG. 6 is a schematic view for describing a substrate-heating mechanism which carries out the present invention.

A substrate-heating stage improved by the present inventors is schematically shown in FIG. 6. In FIG. 6, (a) is a plan view of the stage, and (b) a side view. A substrate stage 13 is prepared using aluminum nitride (AlN), showing good heat conduction, and is so constructed that a heat source 14, a heater, is built in the substrate stage 13 at its part near to the surface. Also, a temperature detector 15 for controlling the heat source is attached to the substrate stage 13 at its part near to the surface. Still also, parameters of PID control (proportional integral and differential control) are optimized to make as small as possible a thermal time constant lying between the heat source 14 and the substrate stage 13.

Figure 7:
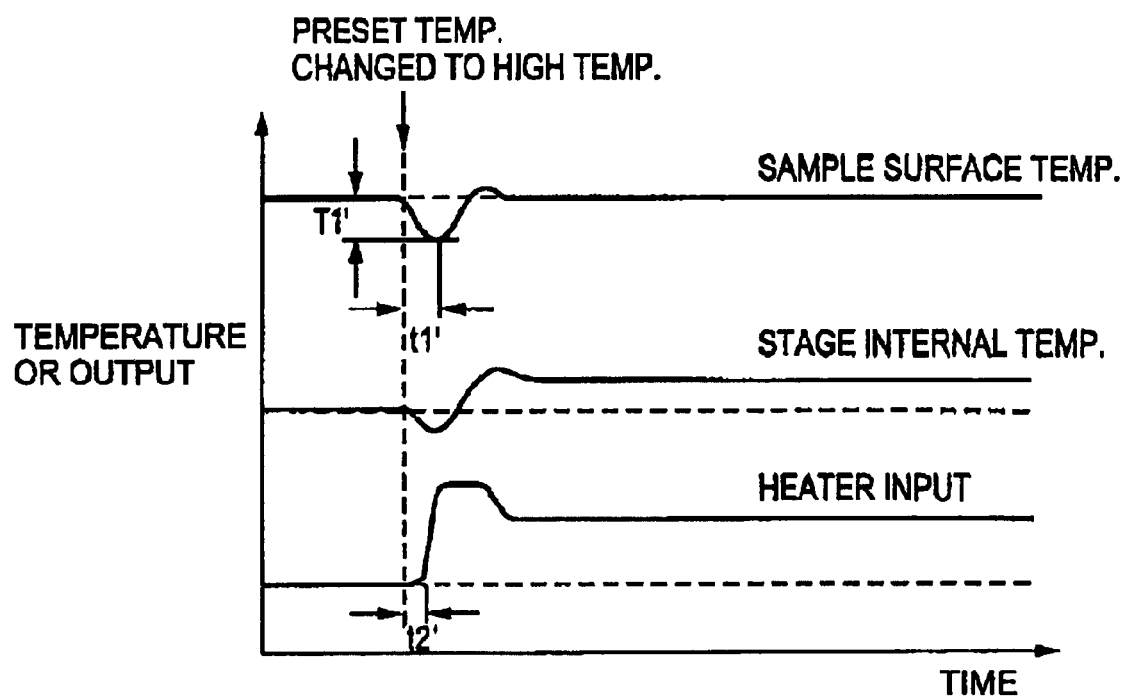
FIG. 7 is a schematic view for describing changes in surface temperature of a silicon substrate in an embodiment.

The results of an experiment made in the same manner as in the case shown in FIG. 5, using this substrate-heating stage, are shown in FIG. 7. As the result, in the case when the gas is fed to the surface of the substrate, it has become possible to make the amount of temperature drop of the substrate surface (T1) and the time until the temperature lowers completely (t1) much smaller than the case shown in FIG. 5.

In the above embodiment, AlN is used as a material for the substrate stage. The material is by no means limited thereto as long as it can show the same effect as that in the case shown in FIG. 7.

The second insulating layer 6b to be formed on the first insulating layer 6a formed by oxidizing the surface of the polycrystalline silicon layer 4 may be formed by, e.g., CVD, PVD (physical vapor deposition) or spin coating, In the case of CVD, usable are a method which utilizes thermal decomposition carried out using TEOS as a material gas, and a method which utilizes thermal decomposition carried out using monosilane or disilane as a material gas. In the case of PVD, sputtering or vacuum vapor deposition may be used. For example, RF (radio frequency) sputtering may be carried out in an Ar/$O_2$ mixed gas, using an $SiO_2$ target, whereby a dense $SiO_2$ film can be obtained. Also, in the case of spin coating, SOG (spin-on-glass) coating may be used.

The gate insulating layer 6 is completed by the process described above.

The TFT formed at a low temperature of 450° C. or below by the process described above has the gate insulating film of 4 nm or more thick on the polycrystalline silicon layer channel region, and the $SiO_2$ film formed by oxidizing the polycrystalline silicon layer is used as the insulating layer. Thus, its interfacial state density can be lowered, and, as the result, the threshold voltage Vth which is one of important characteristics of the TFT can be kept less change with time, as having been so confirmed.

As described above, the employment of surface treatment of the polycrystalline silicon layer by utilizing ozone oxidation enables formation of a thin-film transistor for liquid-crystal display on the inexpensive, unannealed glass substrate.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

We claim:

1. A thin-film transistor comprising:

a glass substrate; and formed at an upper part of said glass substrate are a channel region, a source region, a drain region and an insulating layer, wherein:

said channel region, said source region and said drain region comprise polycrystalline silicon, said glass substrate is defined as having a physical property such that its compaction is 30 ppm or higher, when said glass substrate is heated at 600° C. for 1 hour and thereafter cooled at a rate of 1° C./minute, and said insulating layer covers said channel region.

2. The thin-film transistor according to claim 1, wherein said insulating layer is a silicon oxide layer formed by oxidizing a surface of said channel region at a temperature of 500° C. or below.

3. A thin-film transistor comprising:

a glass substrate; and formed at an upper part of said glass substrate are a channel region, a source region, a drain region and an insulating layer, wherein:

said channel region, said source region and said drain region comprise polycrystalline silicon, said glass substrate is defined as having a physical property such that its compaction is 30 ppm or higher, when said glass substrate is heated at 600° C. for 1 hour and thereafter cooled at a rate of 1° C./minute, and said insulating layer covers said channel region and has a layer thickness defined by the range 4 nm to 20 nm.

4. The thin-film transistor according to claim 3, wherein said insulating layer is a silicon oxide layer formed by oxidizing a surface of said channel region at a temperature of 500° C. or below.

5. A thin-film transistor comprising:

a glass substrate; and formed at an upper part of said glass substrate are a channel region, a source region, a drain region, a first insulating layer and a second insulating layer, wherein:

said channel region, said source region and said drain region comprise polycrystalline silicon, said glass substrate is defined as having a physical property such that its compaction is 30 ppm or higher, when said glass substrate is heated at 600° C. for 1 hour and thereafter cooled at a rate of 1° C./minute, said first insulating layer covers said channel region and has a layer thickness whose lower limit is 4 nm, and said second insulating layer is formed on a surface of said first insulating layer.

6. The thin-film transistor according to claim 5, wherein said first insulating layer is a silicon oxide layer or a silicon oxynitride layer.

7. A thin-film transistor comprising:

a glass substrate; and formed at an upper part of said glass substrate are a channel region, a source region, a drain region, a first insulating layer and a second insulating layer, wherein:

said channel region, said source region and said drain region comprise polycrystalline silicon, said glass substrate is defined as having a physical property such that its compaction is 30 ppm or higher, when said glass substrate is heated at 600° C. for 1 hour and thereafter cooled at a rate of 1° C./minute, and said first insulating layer covers said channel region, and said second insulating layer is formed on a surface of said first insulating layer.

8. The thin-film transistor according to claim 7, wherein said first insulating layer is a silicon oxide layer or a silicon oxynitride layer.

* * * * *